United States Patent
Lin

(12) 
(10) Patent No.: US 6,552,594 B2
(45) Date of Patent: *Apr. 22, 2003

(54) OUTPUT BUFFER WITH IMPROVED ESD PROTECTION

(75) Inventor: Shi-Tron Lin, Taipei (TW)

(73) Assignee: Winbond Electronics, Corp., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/437,817

(22) Filed: Nov. 10, 1999

(65) Prior Publication Data

US 2002/0008563 A1 Jan. 24, 2002

Related U.S. Application Data

(63) Continuation-in-part of application No. 08/826,138, filed on Mar. 27, 1997, now abandoned.

(51) Int. Cl.[7] .................................................. H03L 5/00
(52) U.S. Cl. ........................................ 327/310; 327/319
(58) Field of Search ................................ 327/309, 310, 327/314, 318–320, 325, 330; 361/56, 111

(56) References Cited

U.S. PATENT DOCUMENTS

| | | | |
|---|---|---|---|
| 3,666,969 A | | 5/1972 | Carriere et al. |
| 3,879,687 A | | 4/1975 | Daehlin et al. |
| 4,138,690 A | * | 2/1979 | Nawa et al. ................. 257/570 |
| 5,311,083 A | * | 5/1994 | Wanlass ..................... 307/475 |
| 5,391,948 A | * | 2/1995 | Izumita ....................... 327/565 |
| 5,451,852 A | | 9/1995 | Gusakov |
| 5,508,548 A | * | 4/1996 | Talliet ......................... 257/360 |
| 5,757,591 A | * | 5/1998 | Carr et al. .................. 360/113 |
| 5,793,588 A | * | 8/1998 | Jeong .......................... 361/56 |
| 5,986,863 A | * | 11/1999 | Oh ............................... 361/56 |

FOREIGN PATENT DOCUMENTS

JP 63-250213 10/1988

* cited by examiner

*Primary Examiner*—Kenneth B. Wells
(74) *Attorney, Agent, or Firm*—Ladas & Parry

(57) ABSTRACT

The present invention provides a buffer for voltage ringing and overshooting suppression that improves the ESD protection. The buffer comprises a transistor and a resistance modulator. The resistance modulator is connected in series between an IC pad and a power node. The resistance modulator provides a first resistance during normal circuit operation, and provides a second resistance that is lower than the first resistance during an ESD event.

13 Claims, 12 Drawing Sheets

OUTPUT BUFFER WITH IMPROVED ESD PROTECTION

CROSS-REFERENCE TO RELATED APPLICATIONS

This application is a continuation-in-part of U.S. application Ser. No. 08/826,138, filed Mar. 27, 1997, entitled "IMPROVED ESD PROTECTION IMPLEMENTED WITH DIODES CONNECTED IN PARALLEL TO A SERIES VOLTAGE-RINGING SUPPRESSION-RESISTOR FOR A TRANSISTOR I/O BUFFER," now abandoned which is hereby incorporated by reference.

BACKGROUND OF THE INVENTION

1. Field of the Invention

The present invention relates to the circuit design and method of fabrication for an output buffer implemented in an integrated circuit (IC). More particularly, this invention relates to an improved circuit configuration of an output buffer that improves ESD protection without degrading ringing voltage suppression.

2. Description of the Related Art

The output signals from a CMOS I/O buffer often experience a large amount of voltage ringing and overshooting due to the capacitor produced between the wiring elements and the inductance from the IC package and the motherboard on which the CMOS chip is mounted. A common method for suppressing the voltage ringing and overshooting is to solder a series resistor with a resistance of about 10 ohms to the motherboard next to each CMOS I/O pin, as shown in FIG. 1A. The CMOS I/O buffer 10 has an output buffer 12, a sub-ESD protection circuit 14 and an input buffer 16. The output buffer 12 has a pull-high circuit of PMOS P1 and a pull-low circuit of NMOS N1. Since the output buffer 12 has the ability of high current driving, the PMOS P1 and the NMOS N1 both have wide gate-width and can act as a main-ESD protection circuit. The sub-ESD protection circuit 14, as shown in FIG. 1A, has a resistor with a resistance about 200 ohms connected between the pad and input buffer 16 to slow down the ESD effect during an ESD event. Thus, the PMOS P2 and the NMOS N2, which release the ESD stress during an ESD event, can be designed to have a smaller area than that for the output buffer 12. The participation of the external resistor 18 increases the loading of the output buffer and dampens the voltage ringing and overshooting caused by the parasitic capacitors and inductors produced by wiring and packaging. However, an additional part, such as the external resistor 18, is very extravagant in view of motherboard integration. It increases the total area of motherboard and the complexity of part management. Thus, the design in FIG. 1A is not well considered.

Another method for suppressing voltage ringing and overshooting is to remove the external resistor 18 and to add two on-chip resistors connected in series with the PMOS P1 and the NMOS N1 respectively, as shown in FIG. 1B. Thus, the pull-high circuit comprises a PMOS P1 and a resistor Rp, while the pull-low circuit comprises a NMOS N1 and a resistor Rn. The driving ability of the output buffer 18 is less because of the existence of these two resistors, Rp and Rn. Thus the voltage ringing and overshooting at the pad will be smaller. The larger resistance these two resistors, Rp and Rn, have, the better performance of suppressing can be achieved. However, the resistance of the resistors Rp, Rn should not be so large that the driving requirement of the CMOS I/O buffer 20 is not met. For example, the required driving ability of the NMOS N1 is to sink a DC current of about 8 to 10 mA and a maximum transient current of about 40 mA. For a CMOS I/O buffer, the voltage overload (VOL) specification is typically 0.4V. With the sink current in the above range, in order to comply with the limitation of VOL specification, the resistance of the resistor Rn can't be more than 10 ohm.

The resistor Rn of 10 ohm contributes a voltage of 0.1 volt when the NMOS N1 sinks a DC current of 10 mA and a voltage of 0.4 volt when the NMOS N1 sinks a transient current of 40 mA, thus the pull-low circuit can comply with the VOL specification. Usually, these on-chip resistors Rn, Rp are formed by poly resistors or n-well resistors.

However, while the voltage ringing and overshooting is suppressed, the performance of ESD protection is degraded by the participation of the resistors Rn, Rp. For example, in comparison with the circuit configuration in FIG. 1A, during an ESD event of positive pulse at the pad, the resistor Rn, as shown in FIG. 1B, raises the trigger voltage of the pull-low circuit and induces more ESD stress loading on the sub-ESD protection circuit 14. Thus, the voltage at the sub-ESD protection circuit 14 is higher than before and the probability of ESD damage in the input buffer 16 is increased. Although the resistance of the resistors Rn, Rp is as low as 10 ohm, the discharge current during a ESD event is as large as several amps and makes the trigger voltage at the pad about several ten volts higher than that without the resistor Rn. Thus the resistors Rn, Rp causes the degradation of ESD protection.

Therefore, in the art of circuit design and integrated circuit manufacture, it is needed to provide a circuit configuration with improved ESD protection that suppresses the voltage ringing and overshooting.

SUMMARY OF THE INVENTION

It is therefore an object of the present invention to provide a novel and improved buffer for improving ESD protection without causing any adverse effect to the performance of the voltage ringing and overshooting suppression.

Briefly, in a preferred embodiment, the present invention provides a buffer comprising a transistor and a resistance modulator connected in series between an IC pad and a power node. The resistance modulator provides a first resistance during normal circuit operation, i.e., in the absence of an ESD event, and provides a second resistance that is Lower than the first resistance during an ESD event.

The transistor can be an NMOS transistor while the power node is powered by a voltage source VSS during normal circuit operation. Alternatively, the transistor can be a PMOS transistor while the power node is powered by a voltage source VDD during normal circuit operation.

The present invention also provides an output buffer comprising a pull-high circuit and a pull-low circuit. The pull-high circuit connects between a relatively high power node and an IC pad. The pull-low circuit connects between a relatively low power node and the IC pad. The pull-low circuit has an ESD protection device and a resistance modulator connected in series. The resistance modulator provides a first resistance during normal circuit operation, and provides a second resistance that is lower than the first resistance during an ESD event.

The resistance modulator comprises a resistor and a rectifying circuit connected in parallel. The rectifying circuit can be a diode of a first polarity, a plurality of diodes of a first polarity connected in series, or a first diode of a first polarity and a second diode of a second polarity connected in parallel.

It is an advantage of the present invention that the ESD protection ability is improved without decreasing the ability of the voltage ringing and overshooting suppression. During the circuit operation, the rectifying circuit acts as an open circuit, thereby the resistance modulator has a first resistance to suppress the voltage ringing and overshooting. During the ESD event, the voltage across the resistance modulator becomes high enough to impel the rectifying circuit to act as a short circuit. Therefore, the second resistance of the resistance modulator is lower than the first one to avoid too much voltage rising in the pad, causing damage to other internal circuit, during the ESD event.

Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 2:
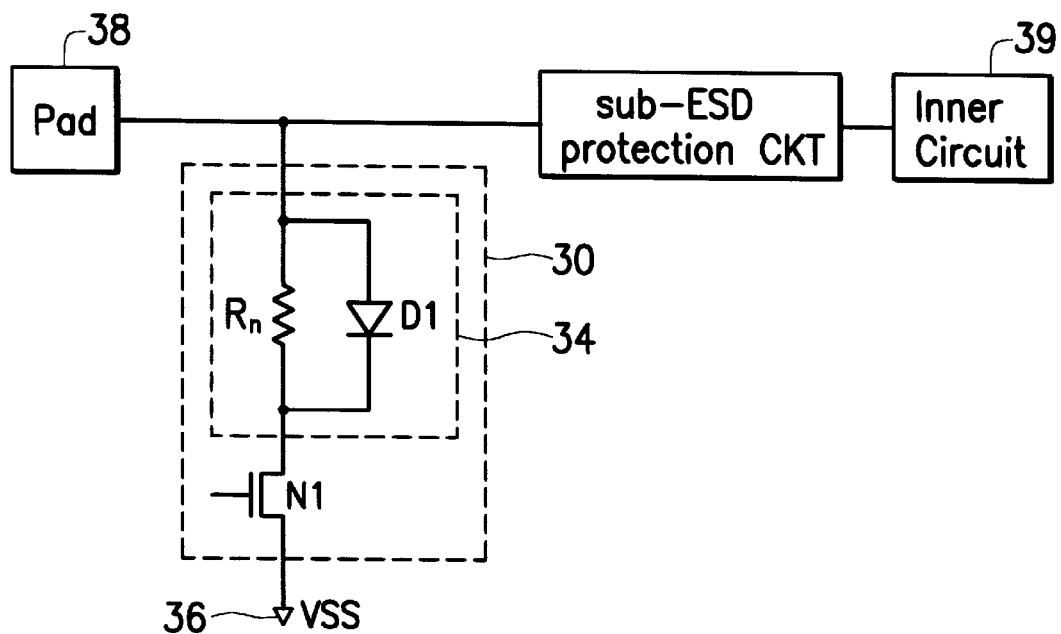
FIG. 2 is a circuit diagram of the buffer according to the present invention.

The present invention provides a buffer that has improved performance in ESD protection and can suppress the voltage ringing and overshooting during normal circuit operation. The buffer according to the present invention has a transistor and a resistance modulator connected in series between an IC pad and a power node. As shown in FIG. 2, while the power node, expressed as a low power node VSS 36, is powered by a voltage source VSS, the buffer 30 according to the present invention has a NMOS transistor N1 and a resistance modulator 34. A resistor Rn and a rectifying circuit, a diode D1, form the resistance modulator 34. One source/drain of the NMOS N1 is connected to the low power node VSS 36. The resistance modulator 34 is connected between the IC pad 38 and another source/drain of the NMOS N1. The resistor Rn and the diode D1 with a first polarity are connected in parallel inside the resistance modulator 34.

The operation of the circuit in FIG. 2 is described as below. During normal circuit operation, i.e., operation the circuit without the occurrence of an ESD event, the buffer 30 acts, in this example, as a pull-low circuit. (Note, however, that in present invention the buffer can also act as a pull-high circuit.) Therefore, all the specification requirements for such an output buffer must be met. This means that the voltage across the resistor Rn should never be higher than the specification of the voltage over load (VOL), 0.4 volt typically, during normal circuit operation. Typically, the threshold voltage for turning on a diode is around 0.7 volt. Therefore, the diode D1 acts as an open circuit during normal circuit operation and the resistor Rn suppresses the voltage ringing and overshooting as in the prior art. During an ESD event, especially a huge positive current impulse appearing at the IC pad, the transient current may be as high as several amperes. Even the resistor Rn is as small as 10 ohm, the voltage across the resistor should be more than the threshold voltage of the diode D1 to turn on the diode D1 for passing some ESD current to the NMOS N1, i.e., the ESD protection device. In other words, the second resistance of the resistance modulator 34 during the ESD event is lower than the first one during the circuit operation, thus the voltage at the pad won't rise so much so that induces damage to the devices of the inner circuit 39.

Figure 3:
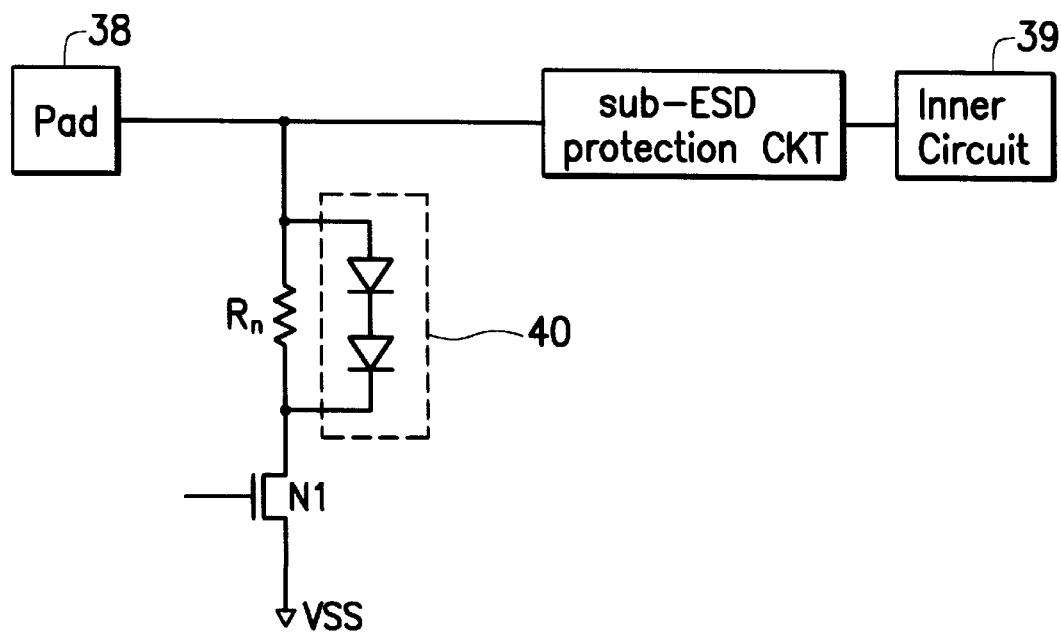
FIG. 3 and FIG. 4 show two alternate preferred embodiments of the present invention.
Figure 4:
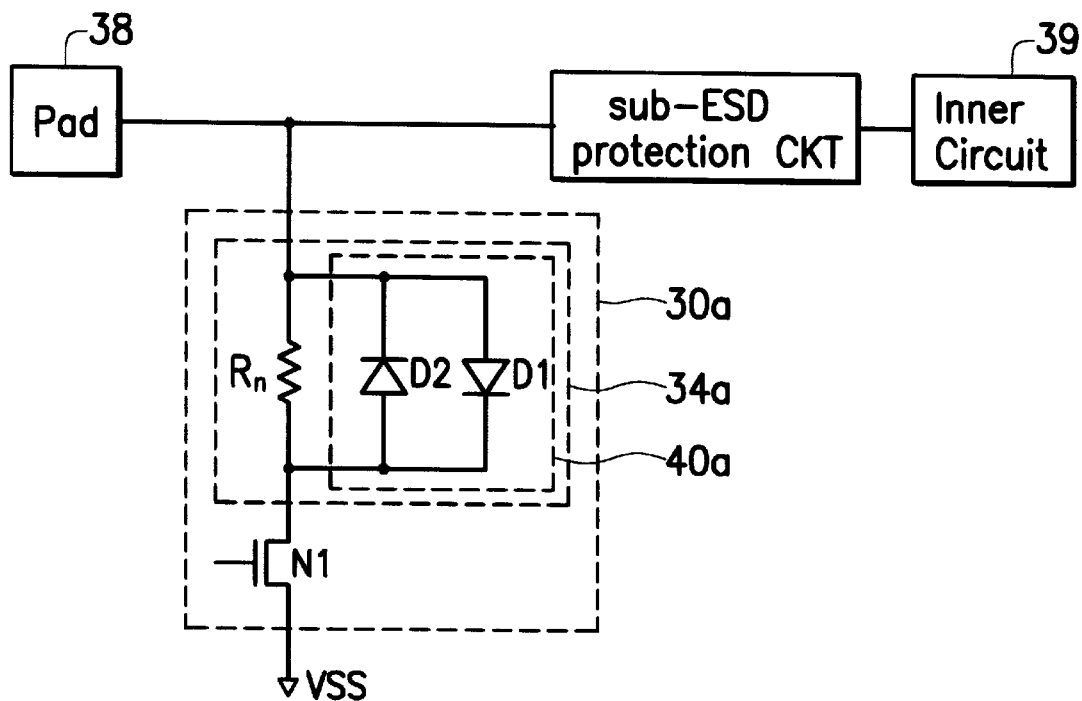
Figure 5:
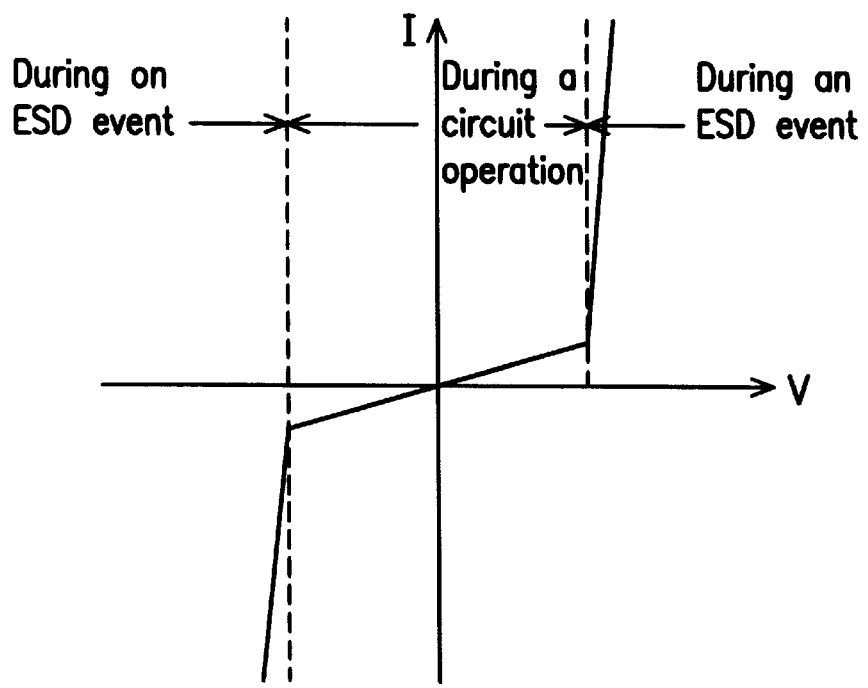
FIG. 5 illustrates the IV curve of the resistance modulator in FIG. 4.

FIG. 3 and FIG. 4 show two alternate preferred embodiments of the present invention. The rectifying circuit 40 can have a plurality of diodes of a first polarity, as shown in FIG. 3. These cascade diodes provide a higher threshold voltage of the rectifying circuit 40. Alternatively, the rectifying circuit 40a can have a first diode of a first polarity D1 and a second diode D2 of a second polarity connected in parallel, as shown in FIG. 4. The buffer 30a in FIG. 4 provides a bi-directional ESD protection. The design concept is to make the resistance modulator 34b have a first (higher) resistance during normal circuit operation, i.e., in the absence of an ESD event, and have a second (lower) resistance during an ESD event. As shown In FIG. 5, the IV curve of the resistance modulator 34a in FIG. 4 illustrates this concept. During the circuit operation, the first diode D1 and the second diode D2 act as an open circuit, thus the resistor Rn dominates the IV curve. However, during an ESD event, either the first diode D1 or the second diode D2 acts as a short circuit and dominates the IV curve with an almost vertical line.

Figure 1A:
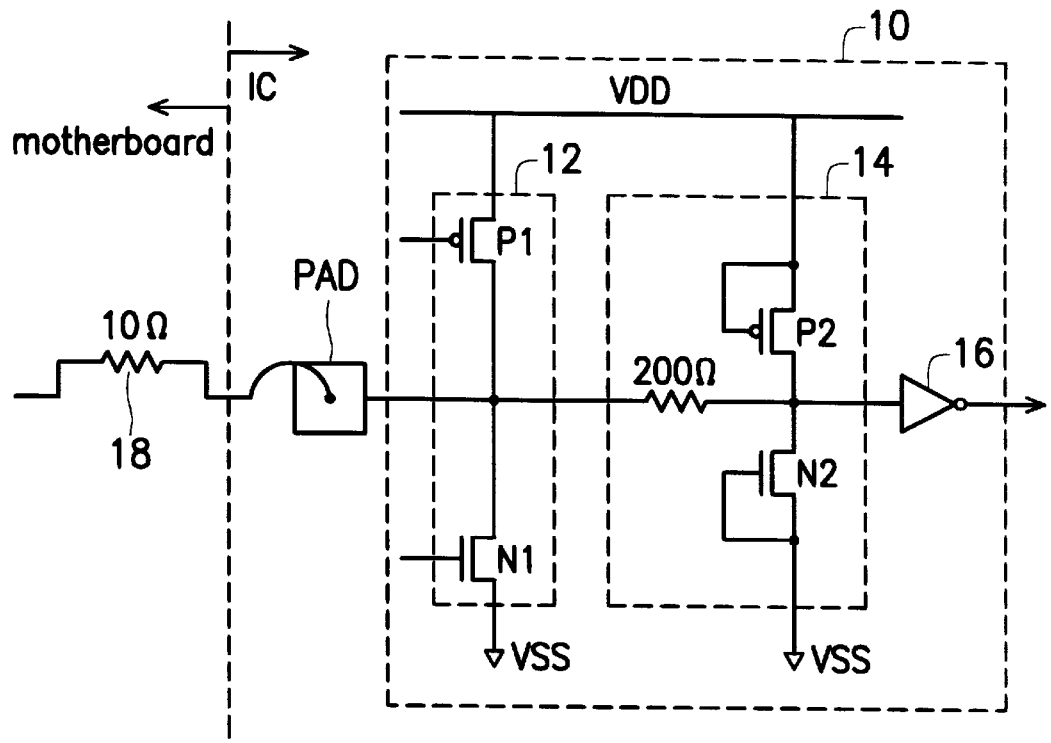
FIGS. 1A and 1B are circuit diagrams showing the convention circuit configuration of the output buffer employed to suppress output voltage ringing and overshooting.
Figure 1B:
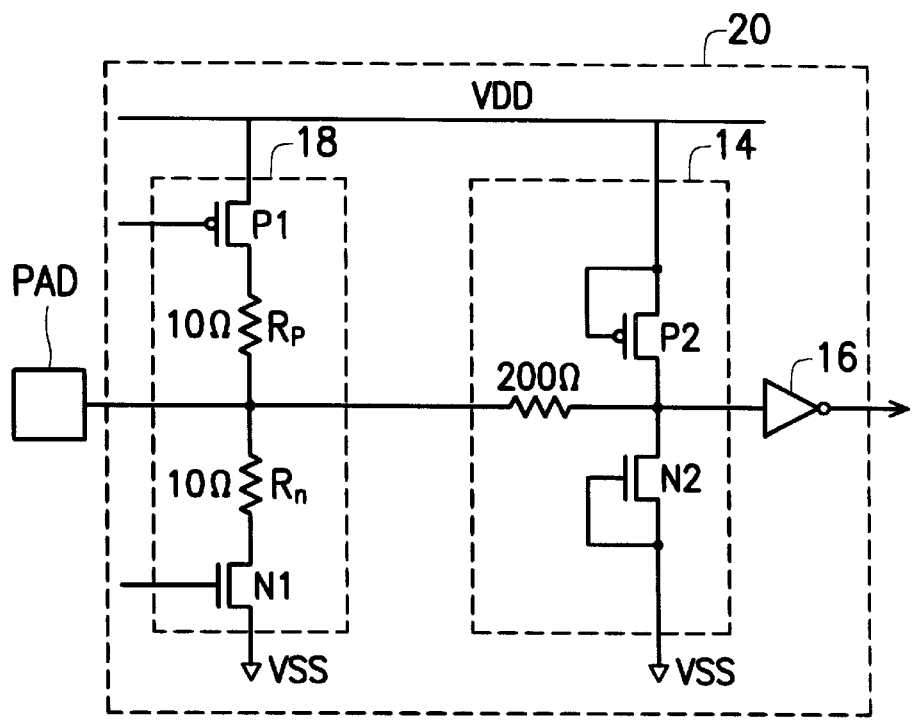

Sub-ESD circuit like 14 in FIGS. 1A and 1B can be applied to the circuits in FIGS. 2, 3 and 4 as well.

Figure 6A:
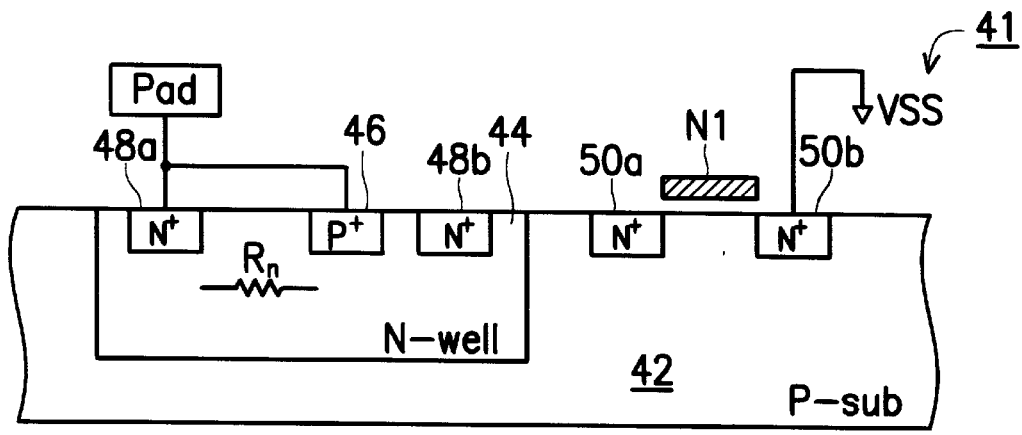
FIG. 6A is the cross sectional view of a semiconductor wafer that embodies the buffer shown in FIG. 2.
Figure 6B:
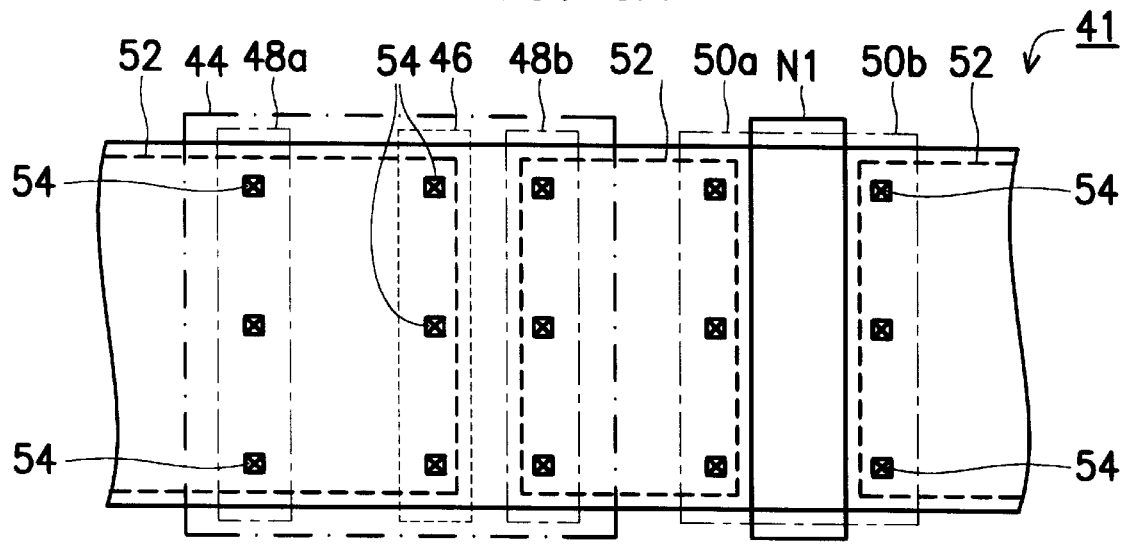
FIG. 6B is the top view of the semiconductor wafer in FIG. 6A.

FIG. 6A is the cross sectional view of a semiconductor wafer that embodies the buffer shown in FIG. 2. FIG. 6B is the top view of the semiconductor wafer in FIG. 6A. As shown in FIG. 6A and FIG. 6B, the buffer is fabricated on a semiconductor wafer 41. The semiconductor wafer 41 has a first-type substrate 42 and a second-type well region 44. The well resistance R-well of the second-type well region 44 forms the resistor Rn in FIG. 2. The first-type substrate 42 would be n-type or p-type, and the second-type well region is opposite to the first-type substrate. For convenience in explanation, we hereafter choose the words of "p-type" and "n-type" in place of the words of "first-type" and "second-type". At least one p-type-doped region 46 is placed in the n-type well region 44 for forming a first junction as the rectifying circuit. Two n-type-doped regions 48a, 48b overlap on the n-type well region 44 and act as two terminals of the resistor Rn. If the sheet resistance of the n-type well region 44 is 200 ohm per square, the width and the length of the n-type well region 44 should be 20 om and 10 om respectively to meet the resistance of 10 ohm of the resistor Rn. The n-type-doped regions 48a, 48b are placed in parallel with the width of the n-type well region 44. The p-type-doped region 46 is positioned between the two n-type-doped regions 48a, 48b. The NMOS N1 with two source/drain regions 50a and 50b on the p-type substrate 42 is placed beside the n-type well region 44. A patterned metal layer 52, as the dashed line in FIG. 5B, and a plurality of contacts 54 implement the interconnections between the rectifying circuit, the resistor Rn and the NMOS N1 form the buffer 30 according to the present invention.

Figure 6C:
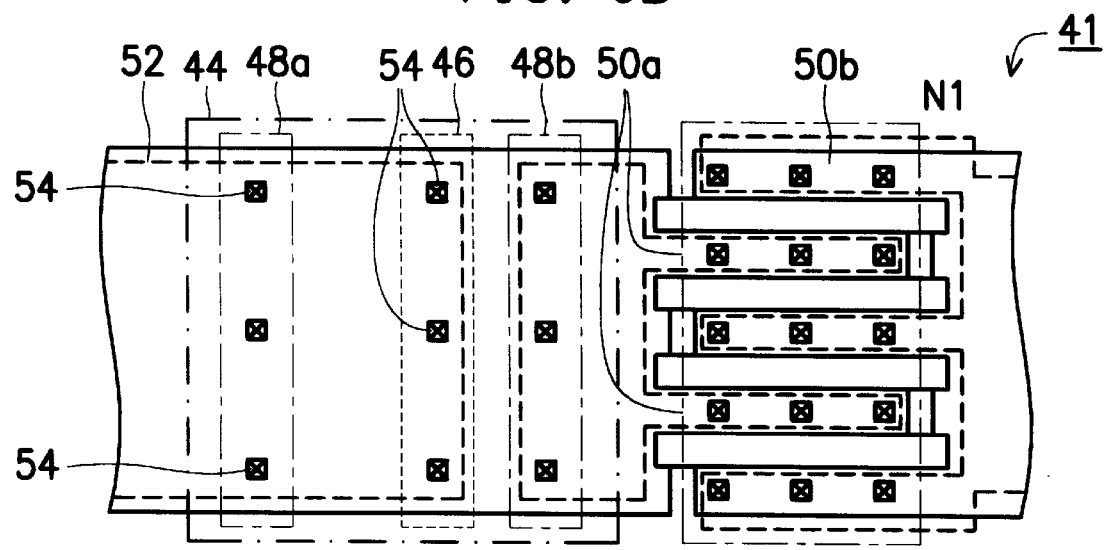
FIG. 6C is the top view of the semiconductor wafer in FIG. 6A with a finger-shaped NMOS.

To implement the driving ability and save silicon area of the NMOS N1, it is popular to replace the layout of the NMOS N1 in FIG. 6B by the layout of the NMOS N1 in FIG. 6C. The NMOS N1 in FIG. 6C is named a finger-shaped NMOS and is integrated by several sub-MOS with their source/drain regions interlaced.

Figure 7A:
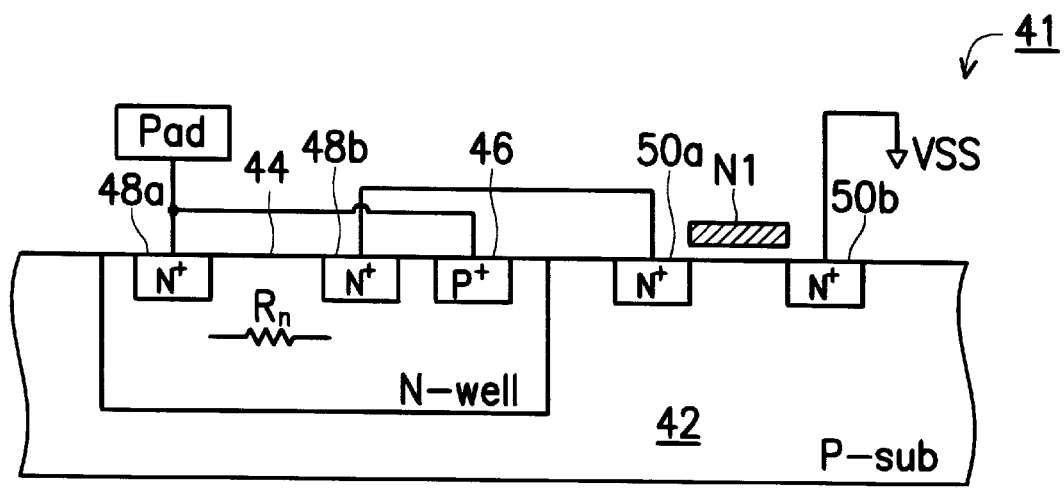
FIG. 7A is another cross sectional view of a semiconductor wafer that embodies the buffer shown in FIG. 2.
Figure 7B:
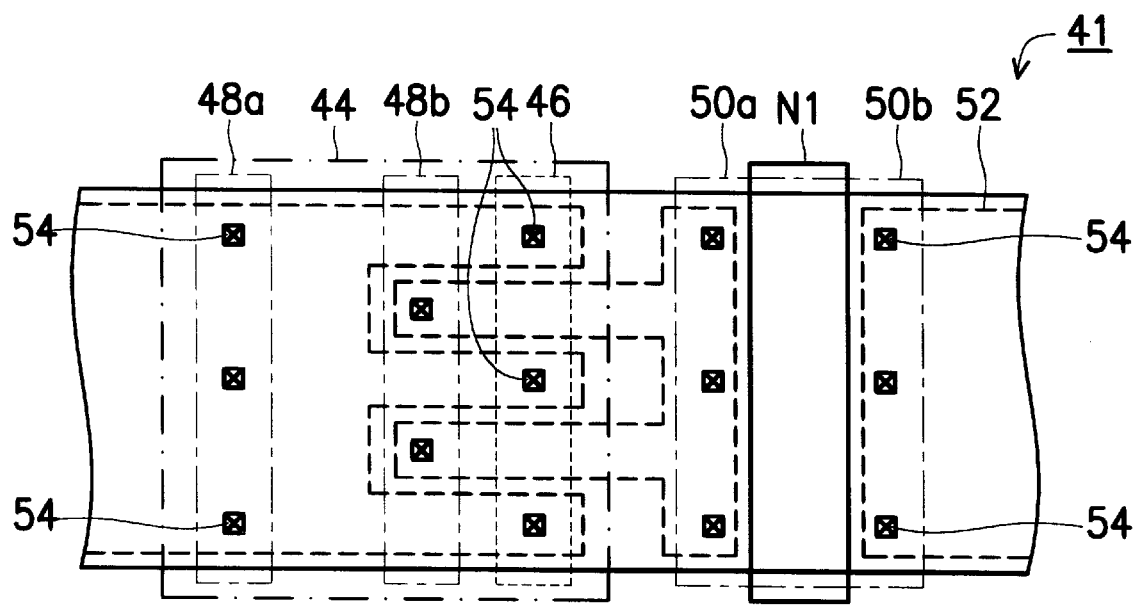
FIG. 7B is the top view of the semiconductor wafer in FIG. 7A.

Many layout variations of the resistance modulator are possible for different circuit design considerations. FIG. 6A to FIG. 6C are two examples. FIG. 7A and FIG. 7B are another variation. As shown in FIG. 7A and FIG. 7B, the two n-type-doped regions 48a, 48b are positioned on the same side of the p-type-doped region 46 to avoid disturbing the resistance of the resistor Rn in the n-type well region 44. The p-type-doped region 46 doesn't obstruct the current flowing in the n-type well region 44, therefore the resistance of the resistor Rn can be easily derived according to the sheet resistance and the layout of the n-type well region 44.

Figure 8A:
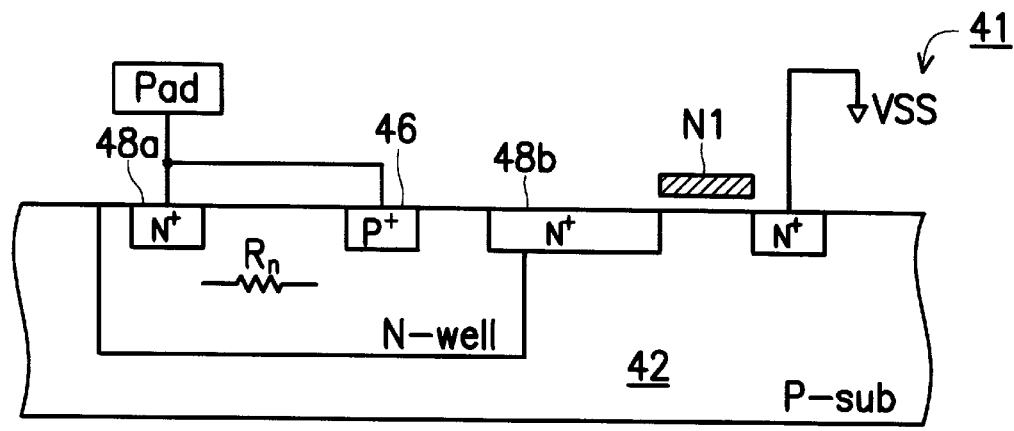
FIG. 8A is another cross section of a semiconductor wafer that embodies the buffer according to the present invention.
Figure 8B:
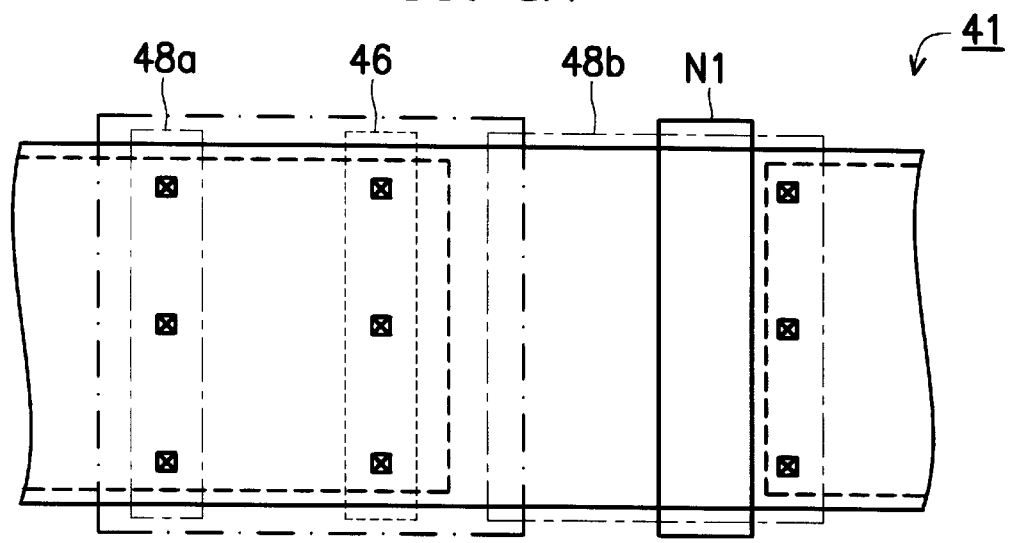
FIG. 8B and FIG. 8C are two possible layouts of the buffer in FIG. 8A.
Figure 8C:
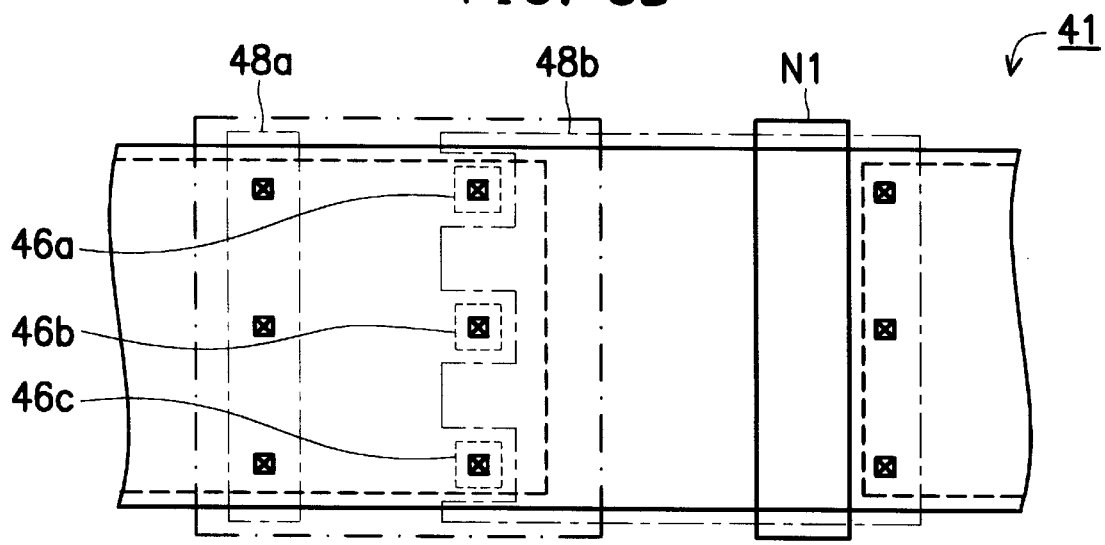

Other possible layout variations of the resistance modulator are shown in FIG. 8A, FIG. 8B and FIG. 8C. FIG. 8A is a cross section of a semiconductor wafer that embodies the buffer according to the present invention. FIG. 8B and FIG. 8C are two possible layouts of the buffer in FIG. 8A. To economize the contact area for interconnection between the NMOS N1 and one terminal of the resistor Rn, one n-type-doped region partly overlays the border of the well and functions as one source/drain of the NMOS transistor, as shown in FIG. 8A and FIG. 8B. To increase the junction area for sustaining large current during an ESD event, the p-type-doped region, which forms the junction, is split as three p-type-doped regions interlacing with one n-type-doped region 46a~46c, as shown in FIG. 8C.

Figure 9A:
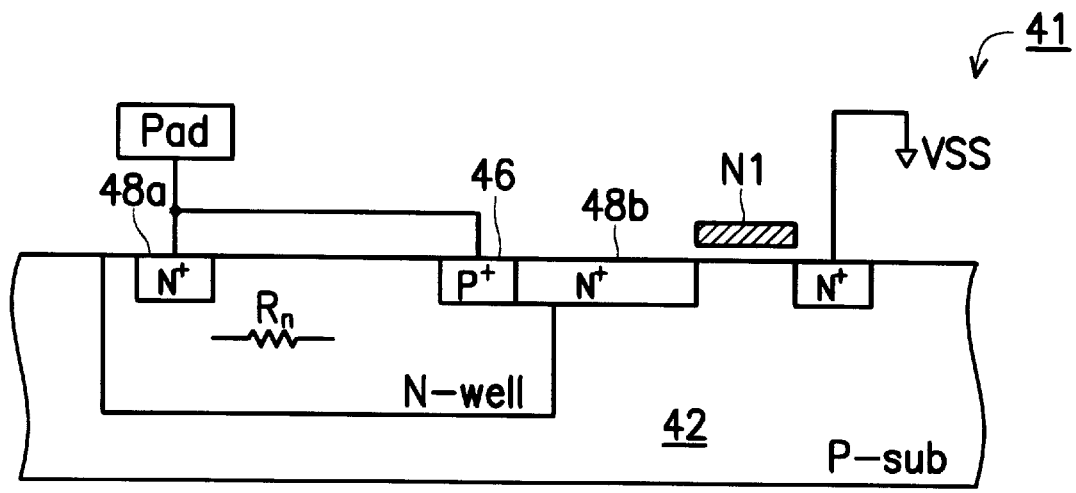
FIG. 9A is the cross sectional view of a semiconductor wafer that embodies the buffer shown in FIG. 2 with the p-type-doped region bordering one n-type-doped region.
Figure 9B:
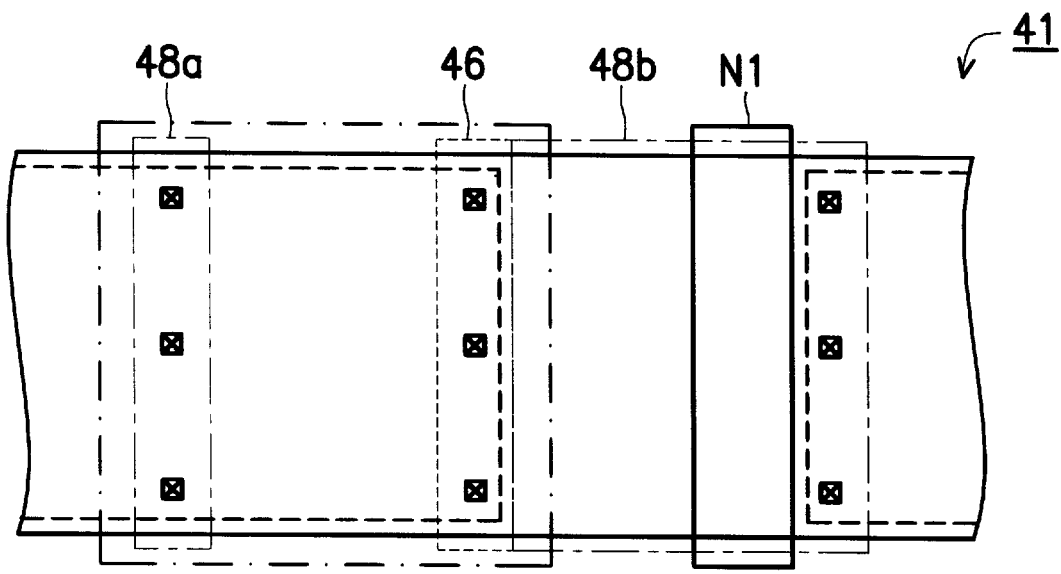
FIG. 9B is the top view of the semiconductor wafer in FIG. 9A.
Figure 10A:
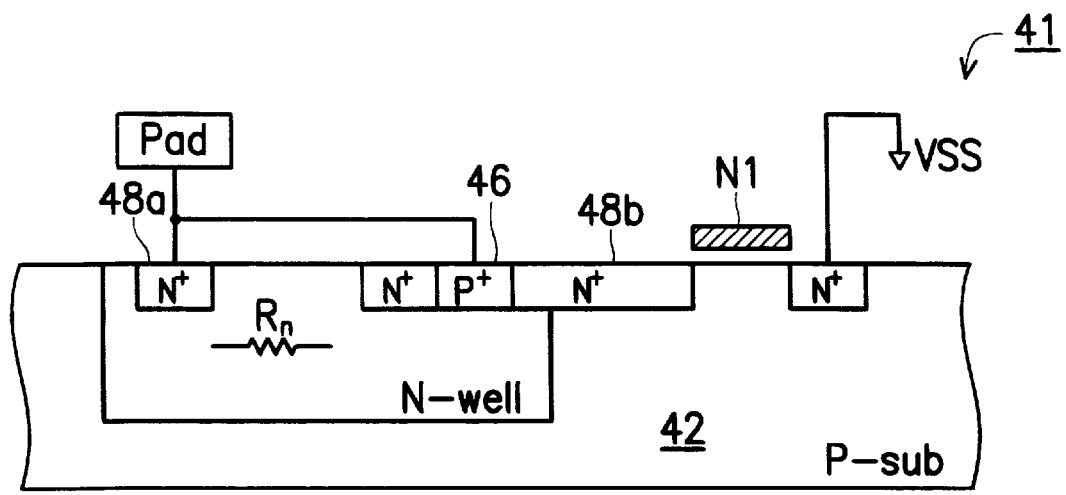
FIG. 10A is the cross sectional view of a semiconductor wafer with the n-type-doped region bordering and enclosing the p-type-doped regions.
Figure 10B:
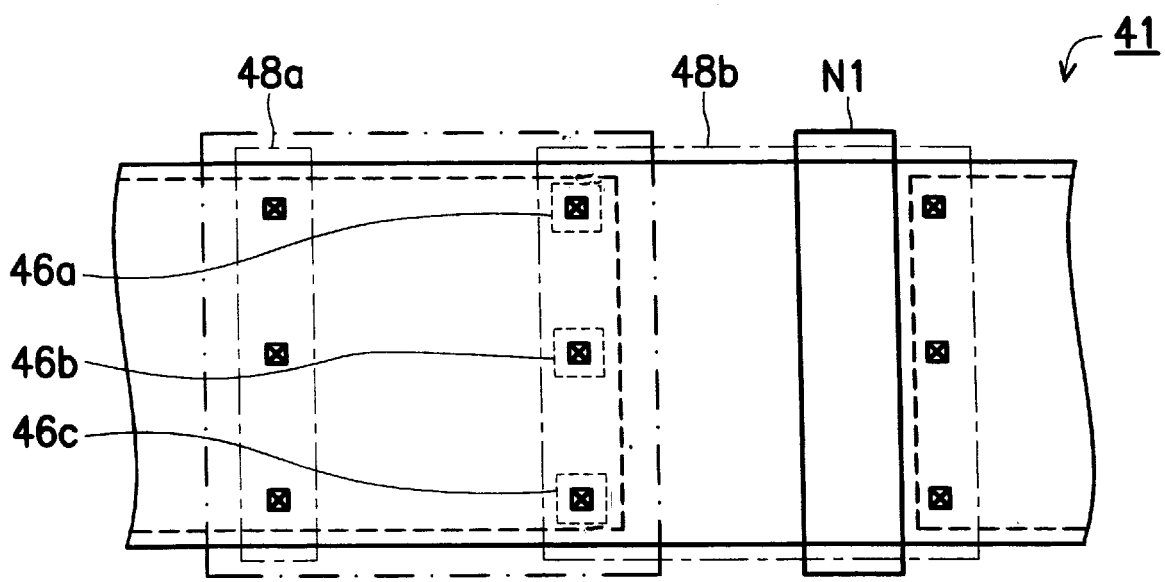
FIG. 10B is the top view of the semiconductor wafer in FIG. 10A.

The p-type-doped region(s) 46 can either contact one n-type-doped region 48b or be separated from one n-type-doped region 48b by a predetermined distance, as shown in FIG. 5A to FIG. 7C. Nevertheless, the resistance modulator with the p-type-doped region(s) bordering one n-type-doped region provides a shorter distance between the junction and the source/drain of the NMOS N1 to reduce the resistance of the resistance modulator during an ESD event, as shown in FIG. 9A and FIG. 9B. A good solution for the aforementioned consideration is shown in FIG. 10A and FIG. 10B. The p-type-doped regions 46a~46c border one n-type-doped region 48b and are enclosed by the n-type-doped region 48b to enlarge the junction area and shorten the distance between p-type-doped regions 46a~46c and the source/drain of the NMOS.

Figure 11A:
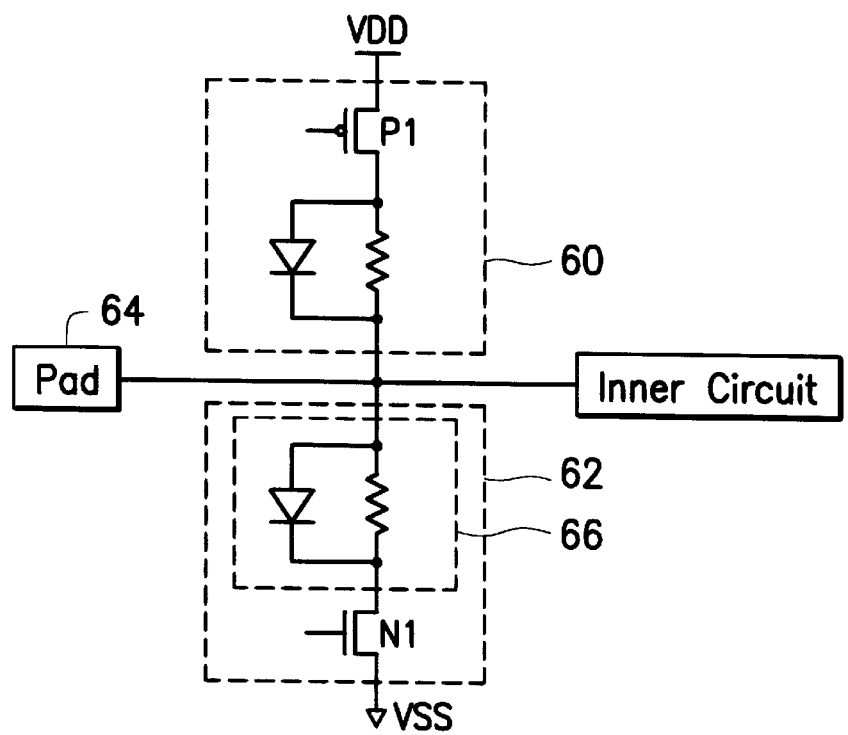
FIG. 11A to FIG. 11D are the schematic illustrations of the buffer according to the present invention.

As shown in FIG. 11A, the present invention provides an output buffer comprising a pull-high circuit 60 and a pull-low circuit 62. The pull-high circuit is connected between a relative-high power node VDD and an IC pad 64. The pull-low circuit 62 is connected between a relative-low power node VSS and the IC pad 64. The pull-low circuit 62 has a resistance modulator 66 and an ESD protection device (an NMOS N1) connected in series. The resistance modulator 66 provides a first resistance during normal circuit operation and a second resistance lower than the first resistance during an ESD event.

Figure 11B:
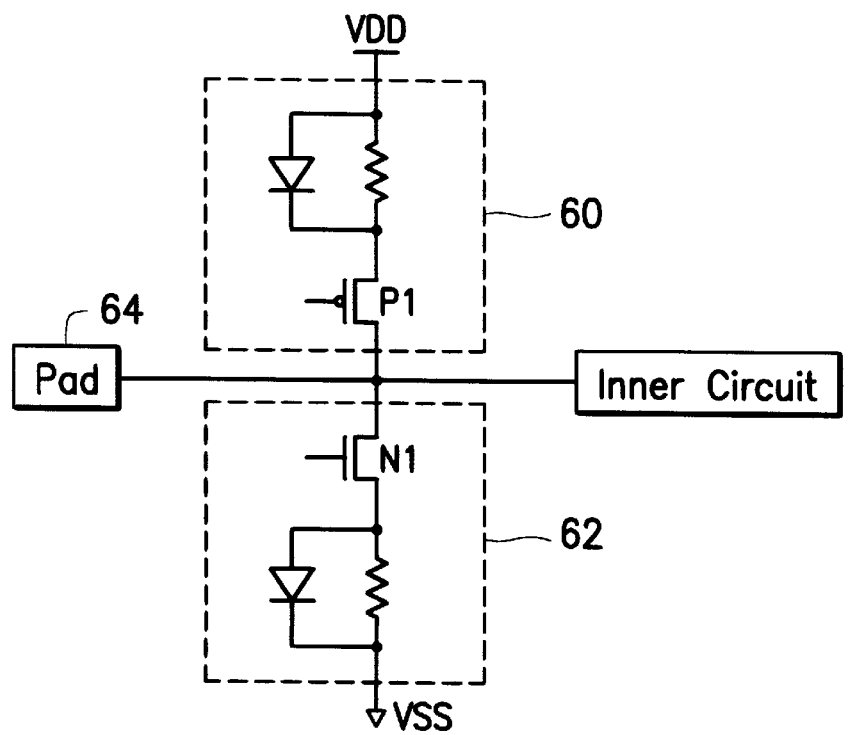
Figure 11C:
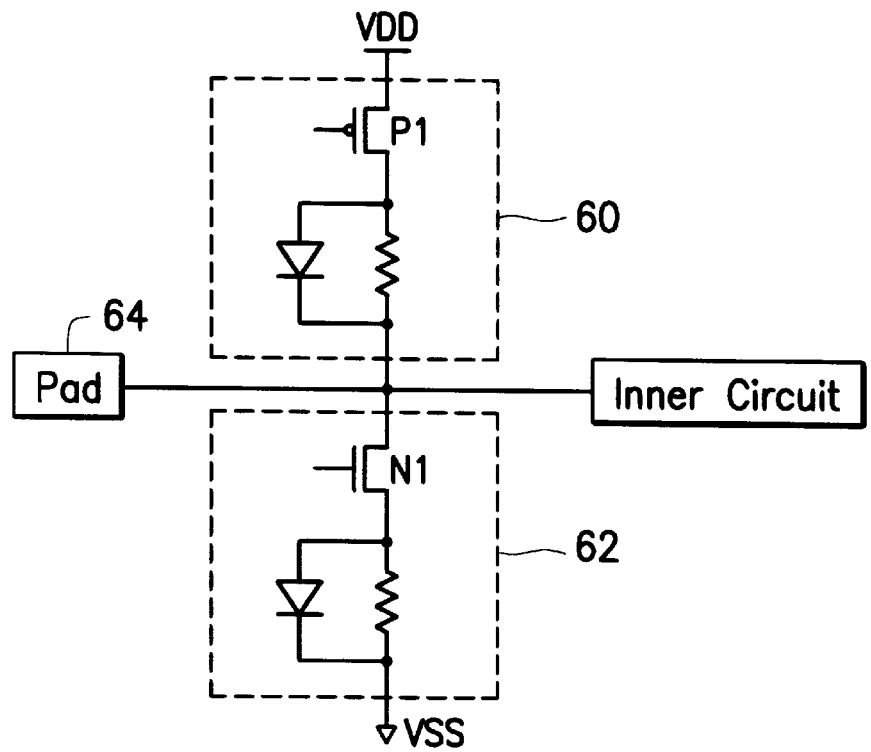
Figure 11D:
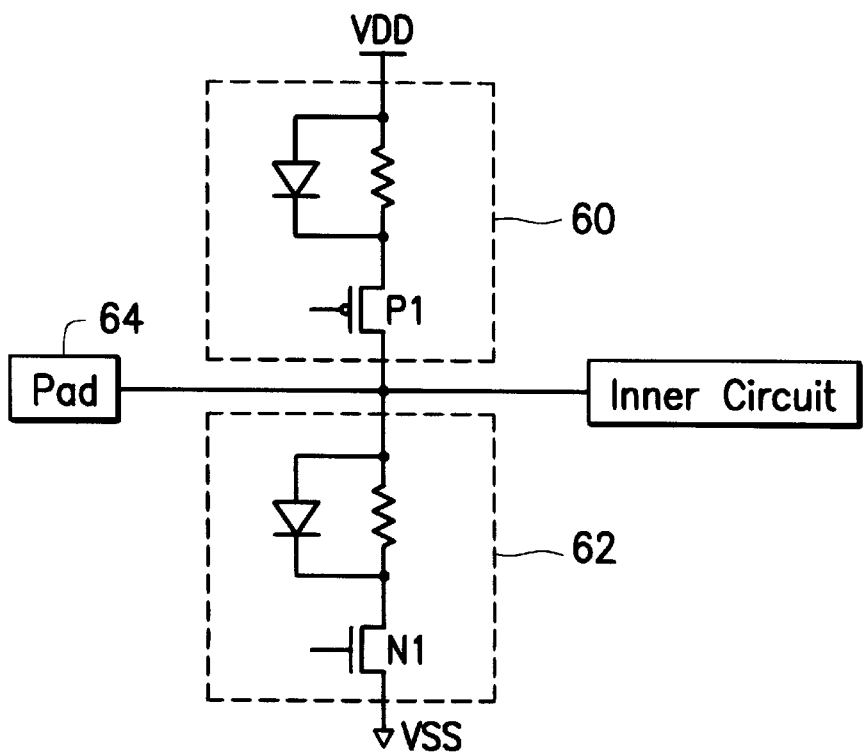

Referencing FIG. 11A, the applications of the present invention are not constrained to the pull-low circuit as mentioned before. The pull-high circuit can take advantage of the concept of the buffer according to the present invention. In FIG. 11A, the buffer also acts as a pull-high circuit if the power node is power by a voltage source VDD during normal circuit operation and the transistor is a PMOS transistor P1. Furthermore, the sequence arrangement of the resistance modulator and the transistor depends on the circuit designer's taste. As the pull-high circuit 60 and the pull-low circuit 62 shown in FIG. 11B, the transistor is a MOS transistor (N1 or P1) with one source/drain connected to the IC pad 64, and the resistance modulator is connected between the power node and another source/drain of the MOS. FIG. 11C and FIG. 11D show two circuit variations according to this concept.

Figure 12A:
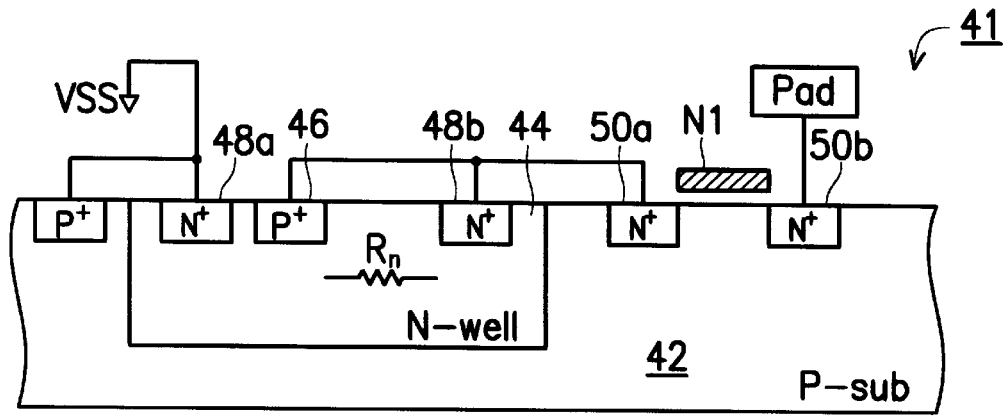
FIG. 12A is one cross sectional view of a semiconductor wafer that embodies the pull-low circuit shown in FIG. 11B.
Figure 12B:
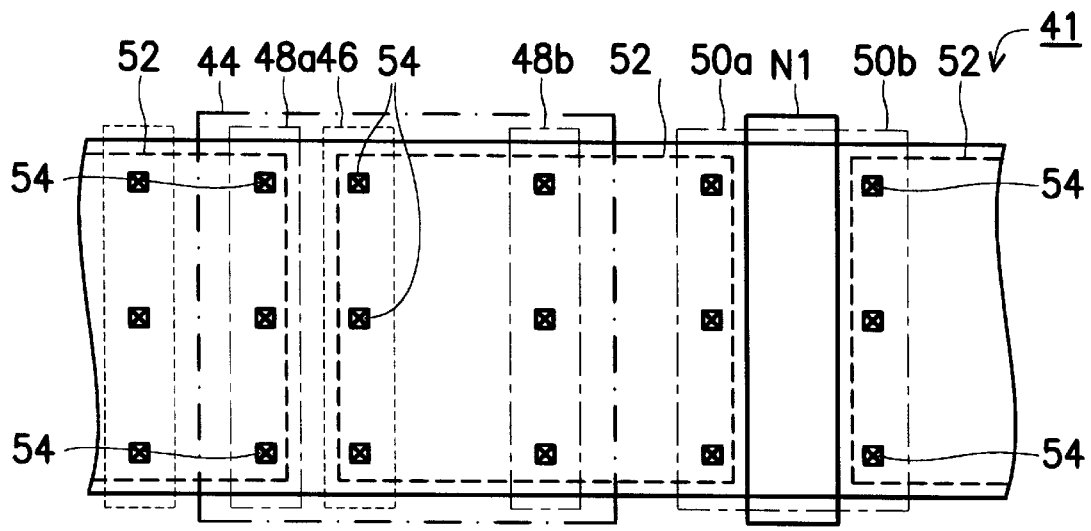
FIG. 12B is the top view of the semiconductor wafer in FIG. 12A.

Please refer to FIG. 12A and FIG. 12B. FIG. 12A is one cross sectional view of a semiconductor wafer that embodies the pull-low circuit shown in FIG. 11B. FIG. 12B is the top view of the semiconductor wafer in FIG. 12A. The pull-low circuit 62 in FIG. 11B is fabricated on a semiconductor wafer 41, as shown in FIG. 12A. The semiconductor wafer 41 has a p-type substrate 42 and an n-type well region 44. The p-type substrate 42 is connected to the relative-low power node VSS through a p-type-doped region. The well resistance R-well of the n-type well region 44 forms the resistor Rn. At least one p-type-doped region 46 is placed in the n-type well region 44 for forming a first junction as the rectifying circuit. Two n-type-doped regions 48a, 48b overlap on the n-type well region 44 and act as two terminals of the resistor Rn. The n-type-doped regions 48a, 48b are placed in parallel with the width of the n-type well region 44. The p-type-doped region 46 is positioned between the two n-type-doped regions 48a, 48b. The NMOS N1 with two source/drain regions 50a and 50b on the p-type substrate 42 is placed beside the n-type well region 44. A patterned metal layer 52, as the dashed line in FIG. 5B, and a plurality of contacts 54 implement the interconnections between the rectifying circuit, the resistor Rn and the NMOS N1 form the pull-low circuit 62 in FIG. 11B according to the present invention.

Figure 13A:
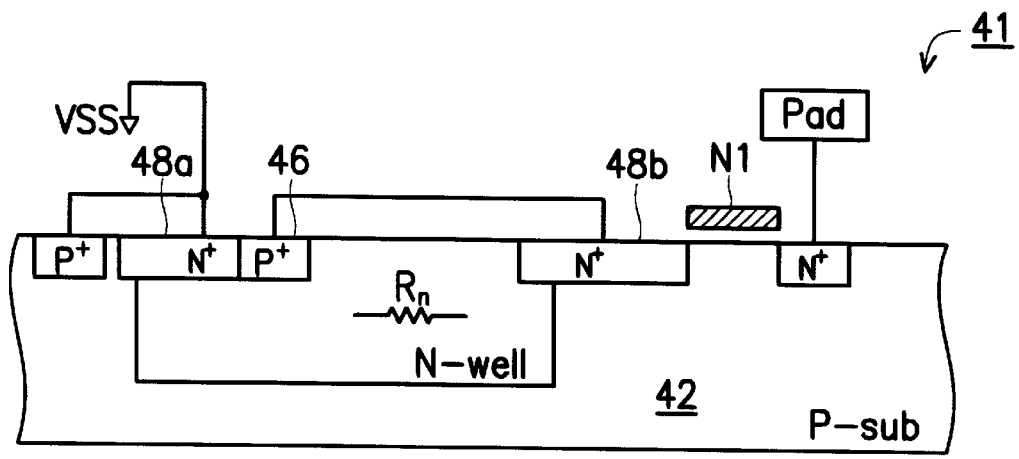
FIG. 13A is another cross sectional view of a semiconductor wafer that embodies the pull-low circuit shown in FIG. 11B.
Figure 13B:
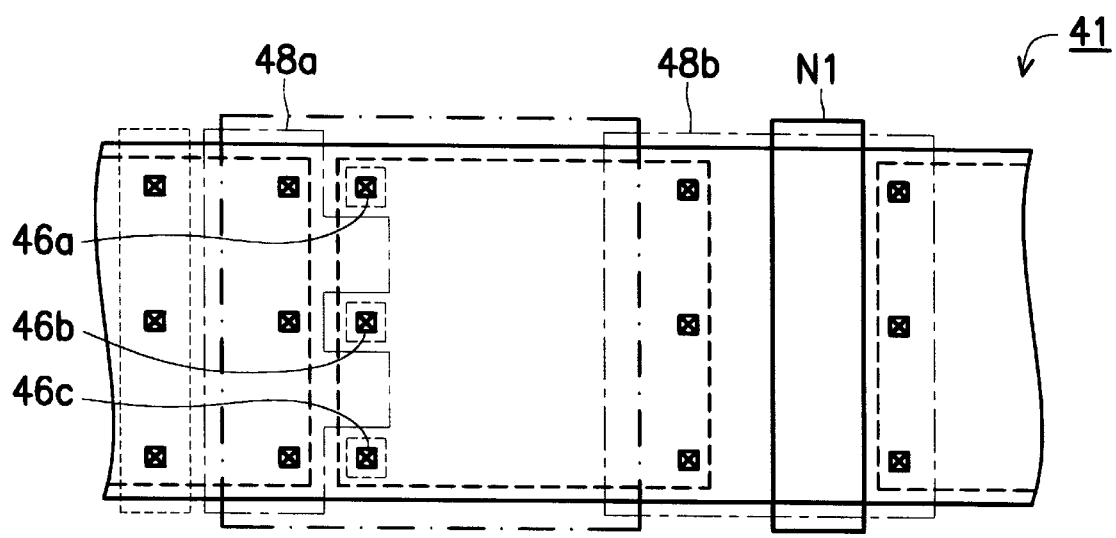
FIG. 13B is the top view of the semiconductor wafer in FIG. 13A.

Please refer to FIG. 13A and FIG. 13B. FIG. 13A is another cross sectional view of a semiconductor wafer that embodies the pull-low circuit shown in FIG. 11B. FIG. 13B is the top view of the semiconductor wafer in FIG. 13A. To economize the contact area for interconnection between the NMOS N1 and one terminal of the resistor Rn, one n-type-doped region partly overlays the border of the well and functions as one source/drain of the NMOS transistor, as shown in FIG. 13A and FIG. 13B. To increase the junction area for sustaining large current during an ESD event, the p-type-doped region, which forms the junction, is split as three p-type-doped regions 46a~46c interlacing with one n-type-doped region, as shown in FIG. 13B.

In summary, the present invention provides a buffer having a transistor and a resistance modulator connected in series between an IC pad and a power node. The resistance modulator provides a first resistance during normal circuit operation to suppress the voltage ringing and overshooting, and provides a second resistance lower than the first resistance during an ESD event to prevent the voltage at the pad from damaging the inner circuit. The present invention also provides several preferred layouts to implement the buffer of the present invention.

In comparison with the buffers in prior art, the buffer according to the present invention has the ability to suppress the voltage ringing and overshooting while improving the performance of the ESD protection.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A buffer comprising a transistor and a resistance modulator connected in series between an IC pad and a power node; wherein the resistance modulator comprises a resistor and a rectifying circuit connected in parallel and the rectifying circuit comprises a plurality of diodes of a first polarity connected in series; and the resistance modulator provides a first resistance during circuit operation, and provides a second resistance lower than the first resistance during an ESD event.

2. A buffer comprising a transistor and a resistance modulator connected in series between an IC pad and a power node; wherein the resistance modulator comprises a resistor and a rectifying circuit connected in parallel and the rectifying circuit comprises a first diode of a first polarity and a second diode of a second polarity connected in parallel; and the resistance modulator provides a first resistance during circuit operation, and provides a second resistance lower than the first resistance during an ESD event.

3. A buffer comprising a transistor and a resistance modulator connected in series between an IC pad and a power node; wherein the resistance modulator comprises a resistor and a rectifying circuit connected in parallel, the buffer is fabricated on a semiconductor wafer having a second-type well region for forming the resistor, at least a first-type-doped region inside the well for forming a first junction as the rectifying circuit and two second-type-doped regions respectively overlapping on the second-type well region as two terminals of the resistance and the resistance modulator provides a first resistance during circuit operation, and provides a second resistance lower than the first resistance during an ESD event.

4. The buffer of claim 3, wherein one second-type-doped region is positioned on one side of the first-type-doped region, and the other second-type-doped region is positioned on the other side of the first-type-doped region.

5. The buffer of claim 3, wherein the two second-type-doped regions are positioned on the same side of the first-type-doped region.

6. The buffer of claim 3, wherein one second-type-doped region partly overlaps the border of the well and functions as one source/drain of the transistor.

7. The buffer of claim 3, wherein the first-type-doped region is separated from one second-type-doped region by a predetermined distance.

8. The buffer of claim 3, wherein the first-type-doped region contacts one second-type-doped region.

9. The buffer of claim 3, wherein the semiconductor wafer comprises at least two first-type-doped regions interlacing with one second-type-doped region.

10. The buffer of claim 3, wherein said at least a first-type-doped region is enclosed by one second-type-doped region.

11. An output buffer, comprising:
a pull-high circuit connected between a relatively-high power node and an IC pad; and
a pull-low circuit connected between a relatively-low power node and the IC pad, the pull-low circuit having a resistance modulator and an ESD protection-device connected in series;
wherein the resistance modulator comprises a resistor and a rectifying circuit connected in parallel and the rectifying circuit comprises a plurality of diodes of a first polarity connected in series; the resistance modulator provides a first resistance during circuit operation, and provides a second resistance lower than the first resistance during an ESD event.

12. An output buffer, comprising:
a pull-high circuit connected between a relatively-high power node and an IC pad; and
a pull-low circuit connected between a relatively-low power node and the IC pad, the pull-low circuit having a resistance modulator and an ESD protection device connected in series;
wherein the resistance modulator comprises a resistor and a rectifying circuit connected in parallel and the rectifying circuit comprises a first diode of a first polarity and a second diode of a second polarity connected in parallel; the resistance modulator provides a first resistance during circuit operation, and provides a second resistance lower than the first resistance during an ESD event.

13. An electrostatic discharge (ESD) protection buffer wherein said buffer is formed on a semiconductor substrate and connected between an integrated circuit input pad and a power node, said ESD protection buffer comprising:
a transistor and
a resistance modulator connected in series with said transistor,
said resistance modulator comprising:
a first-type semiconductor substrate;
a second-type well region formed within said semiconductor substrate;
a first-type doped region formed within said well region;

a first second-type doped region formed within said well region and electrically connected to said first-type doped region formed within said well region; and a second second-type doped region at least partially formed within said well region;

and said transistor comprising a finger-shaped NMOS or PMOS transistor with a plurality of interlaced source and drain regions disposed within said semiconductor substrate, wherein said resistance modulator has a first resistance to suppress voltage ringing and overshooting when said integrated circuit pad is sending or receiving a signal and said resistance modulator has a second resistance lower than the first resistance when an ESD event is present at said integrated circuit pad.

* * * * *